US007662486B2

(12) United States Patent
Wu

(10) Patent No.: US 7,662,486 B2
(45) Date of Patent: Feb. 16, 2010

(54) LIGHT EMISSION MATERIAL AND ORGANIC ELECTROLUMINESCENT DEVICE USING THE SAME

(75) Inventor: Pei-Chi Wu, Kaohsiung (TW)

(73) Assignee: AU Optronics Corp., Hsin-Chu (TW)

( * ) Notice: Subject to any disclaimer, the term of this patent is extended or adjusted under 35 U.S.C. 154(b) by 492 days.

(21) Appl. No.: 11/251,900

(22) Filed: Oct. 18, 2005

(65) Prior Publication Data

US 2006/0286404 A1    Dec. 21, 2006

(30) Foreign Application Priority Data

Jun. 15, 2005  (TW) ............................... 94119903 A

(51) Int. Cl.
*H01L 51/54* (2006.01)
*C09K 11/06* (2006.01)

(52) U.S. Cl. .................. 428/690; 428/917; 313/504; 313/506; 257/E51.044; 546/4; 548/101

(58) Field of Classification Search ........................ None
See application file for complete search history.

(56) References Cited

U.S. PATENT DOCUMENTS

| | | |
|---|---|---|
| 6,670,645 B2 | 12/2003 | Grushin et al. |
| 6,687,266 B1 | 2/2004 | Ma et al. |
| 2002/0134984 A1* | 9/2002 | Igarashi ...................... 257/79 |
| 2004/0091738 A1* | 5/2004 | Psai et al. .................... 428/690 |

OTHER PUBLICATIONS

Coppo et al., "Tuning iridium(III) phenylpyridine complexes in the "almost blue" region", Chem. Commun., 2004, pp. 1774-1775 (first published as an Advance Article on the web Jun. 30, 2004).*

\* cited by examiner

*Primary Examiner*—Marie R. Yamnitzky
(74) *Attorney, Agent, or Firm*—Bacon & Thomas, PLLC

(57) ABSTRACT

An organic electroluminescent device including a substrate, an anode, a cathode, a hole transport layer, an electron transport layer and an emission layer is provided. The anode and the cathode are disposed on the substrate. The hole transport layer is disposed between the anode and the cathode. The electron transport layer is disposed between the hole transport layer and the cathode. The emission layer is disposed between the hole transport layer and the electron transport layer. The chemical structure of the dopant is represented by formula [I]:

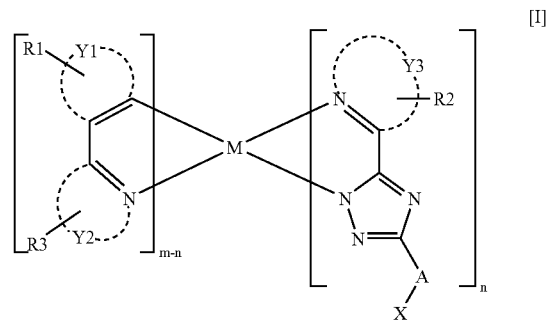

"M" represents a metal atom, m is smaller than or equal to the ligand number of "M", n is smaller than m. "Y1" is selected from aryl or heteroaryl. "Y2" and "Y3" are respectively selected from nitrogen-containing heterocyclic ring. "X", "R1", "R2" and "R3" are respectively selected from any substituent group or hydrogen. "A" is selected from aryl, heteroaryl or nitrogen-containing heterocyclic group.

6 Claims, 2 Drawing Sheets

LIGHT EMISSION MATERIAL AND ORGANIC ELECTROLUMINESCENT DEVICE USING THE SAME

This application claims the benefit of Taiwan application Serial No. 94119903, filed Jun. 15, 2005, the subject matter of which is incorporated herein by reference.

BACKGROUND OF THE INVENTION

1. Field of the Invention

The invention relates in general to an emission material, and more particularly to a phosphorescent emission material and the organic electroluminescent device using the same.

2. Description of the Related Art

In recent years, organic electroluminescent display has gained a rapid growth, and transition metal complex compounds are widely applied to the emission material. Take the emission layer for example, the emission material is categorized as fluorescent type and phosphorescent type. The luminous efficiency of the phosphorescent type is about three times as higher as that of the fluorescent type. The phosphorescence normally exists in the form of transition metal complex compounds. Due to the heavy-atom effect, intersystem crossing would occur, triplet excitation state is formed, the occurrence of phosphorescence is increased, and the fluorescent intensity is weakened. Therefore, the development of a phosphorescent material with high efficient is critical to increase the luminance efficiency of the entire device.

The recent development in the phosphorescent material is focused on transition metal complex compound. In prior art and related patents, the central metal of phosphorescent material is focused on transition metal with $d^6$ configuration such as platinum (Pt), osmium (Os), iridium (Ir), rhenium (Re) and ruthenium (Ru). Iridium metal, having the features of stronger bonding with ligand, long-lived excitation state and higher luminous efficiency, is conventionally used as the central metal of phosphorescent material. In recent years, the development of the blue phosphorescent material is focused on iridium metal complex compound, and iridium (III)bis(4,6-di-fluolophenyl)-pyridinato-N,C2') picolinate (Flrpic) blue phosphorescent material is the most popular one.

The Flrpic blue phosphorescent material is poor in sublimation, so temperature control during the purification process becomes a critical factor. Moreover, the temperature of the Flrpic blue phosphorescent material during the sublimation and purification process is hard to control, so that the Flrpic blue phosphorescent material is decomposed during the sublimation and purification process, causing the yield rate of the Flrpic blue phosphorescent material to decrease.

It can be seen from prior art and related patents that the maximum wavelength of emission ($\lambda_{max}$) of the Flrpic blue phosphorescent material in solution state is 476,492 (nm), the maximum wavelength of emission of the device using the Flrpic blue phosphorescent material is 475,498 (nm), and the CIE[x, y] value of the device is [0.16, 0.29]. Therefore, the photochromism of the Flrpic blue phosphorescent material and the device using the same is not blue enough.

SUMMARY OF THE INVENTION

It is therefore the object of the invention to provide an emission material and the organic electroluminescent device using the same. The emission material formed according to iridium and pyridyl-triazole ligand has the features of easy sublimation, quick response and high output rate and is capable of resolving the problems of difficult sublimation, poor heat-stability, and long purification time encountered in the conventional manufacturing process of the Flrpic blue phosphorescent material. With the features of easy sublimation, quick response and high output rate, the emission material synthesized according to the invention requires a shorter purification time than conventional Flrpic blue phosphorescent material.

Besides, the maximum wavelength of emission ($\lambda_{max}$) of the emission material of the invention in resolution is 462,492 (nm), the $\lambda_{max}$ of the device using the emission material of the invention is 464,488 (nm), and the CIE[x, y] value of device is [0.16, 0.27]. However, the $\lambda_{max}$ of the Flrpic blue phosphorescent material in solution state is 476,492 (nm), the $\lambda_{max}$ of the device using Flrpic blue phosphorescent material is 475, 498 (nm), and the CIE[x, y] value of device is [0.16, 0.29]. Therefore, the emission material of the invention has a bluer photochromism than the Flrpic blue phosphorescent material does, and the device using the emission material of the invention has a bluer photochromism than the device using Flrpic blue phosphorescent material. It can be seen that the emission material of the invention is ideal for the blue phosphorescent material, applicable to a blue phosphorescent device, and is indeed a big breakthrough in terms of the research and development of the blue phosphorescent material.

According to an object of the invention, the invention provides a emission material whose chemical structure is represented by formula [I]:

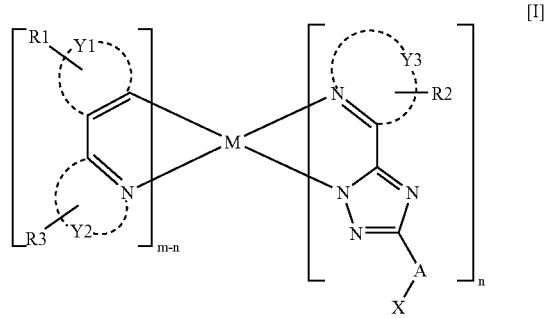

"M" represents a metal atom whose atomic weight is greater than 40. m is smaller than or equal to the ligand number of "M". n is a positive integral and is smaller than m. "Y1" is selected from aryl or heteroaryl. "Y2" and "Y3" are respectively selected from nitrogen-containing heterocyclic ring. "X", "R1", "R2" and "R3" are respectively selected from any substituent group or hydrogen. "A" is selected from aryl, heteroaryl or nitrogen-containing heterocyclic group.

According to another object of the invention, an organic electroluminescent device (OELD) is provided. The OELD includes a substrate, an anode, a cathode, a hole transport layer, an electron transport layer and a emission layer. The anode and the cathode disposed on the substrate, the hole transport layer is disposed between the anode and the cathode, and the electron transport layer is disposed between the hole transport layer and the cathode. The emission layer is disposed between the hole transport layer and the electron transport layer, and the emission layer comprises a host and a dopant. The chemical structure of the dopant is represented by the formula [I]:

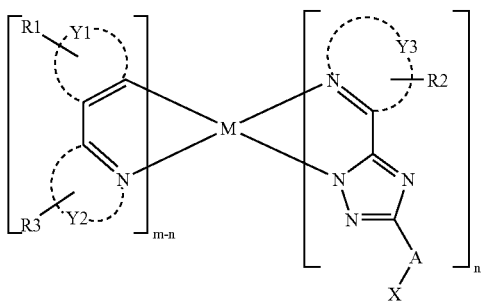

"M" represents a metal atom whose atomic weight is greater than 40. m is smaller than or equal to the ligand number of "M". n is a positive integral and is smaller than m. "Y1" is selected from aryl or heteroaryl. "Y2" and "Y3" are respectively selected from nitrogen-containing heterocyclic ring. "X", "R1", "R2" and "R3" are respectively selected from any substituent group or hydrogen. "A" is selected from aryl, heteroaryl or nitrogen-containing heterocyclic group.

Other objects, features, and advantages of the invention will become apparent from the following detailed description of the preferred but non-limiting embodiments. The following description is made with reference to the accompanying drawings.

DETAILED DESCRIPTION OF THE INVENTION

First Embodiment

Figure 1:
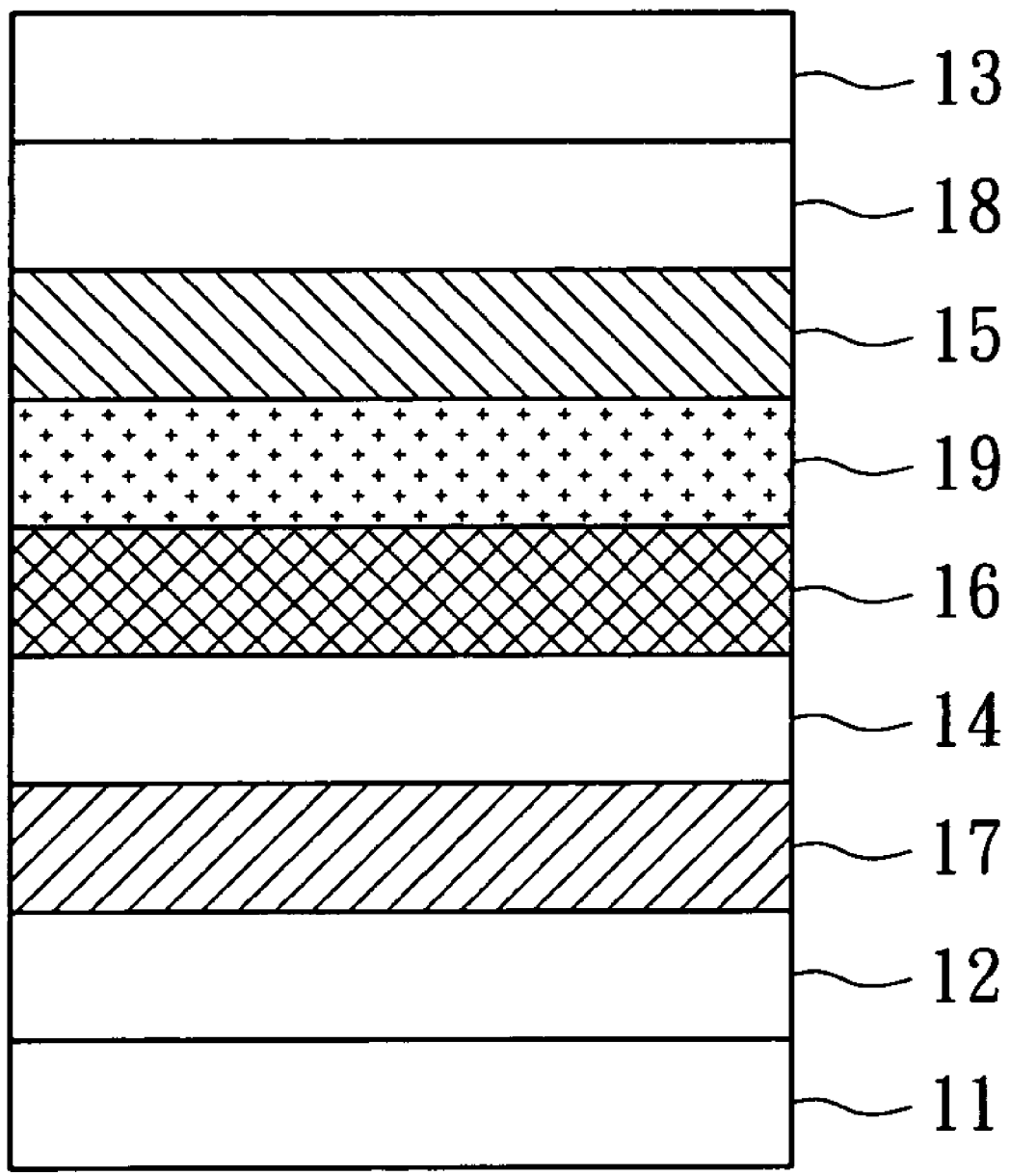
FIG. 1 is a structural diagram of an OLED according to a second embodiment of the invention.

The invention provides an emission material having the features of easy sublimation, quick response and high output rate, therefore requires a shorter purification time than conventional Flrpic blue phosphorescent material. Compared with the conventional device using the Flrpic blue phosphorescent material, the device using the emission material of the invention obtains higher luminous efficiency and lower CIE value and has a bluer photochromism. The emission material of the invention is represented by chemical formula [I]:

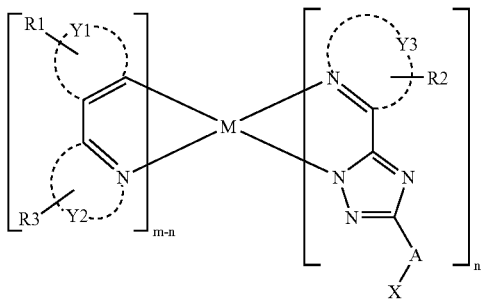

"M" represents a metal atom whose atomic weight is greater than 40. m is smaller than or equal to the ligand number of "M". n is a positive integral and is smaller than m. "Y1" is selected from aryl or heteroaryl. "Y2" and "Y3" are respectively selected from nitrogen-containing heterocyclic ring. "X", "R1", "R2" and "R3" are respectively selected from any substituent group or hydrogen. "A" is selected from aryl, heteroaryl or nitrogen-containing heterocyclic group.

"M" is selected from osmium (Os), ruthenium (Ru), iridium (Ir), platinum (Pt), rhenium (Re), thallium (Tl), palladium (Pd) or rhodium (Rh)

"A" is selected from pyridine, benzene, naphthalene, anthracene, phenanthrene or biphenyl.

"X", "R1", "R2" and "R3" are respectively selected from alkyl, alkoxy, haloakyl, halogen, cyano group or electron-withdrawing group.

Moreover, the emission material disclosed above can be a blue emission material such as a blue phosphorescent dopant. Besides, the emission material of the embodiment can also be manufactured of phosphorescent material or fluorescent material of other colors.

In the embodiment, the emission material is formed by iridium (Ir) and pyridyl-triazole ligand I. The iridium (Ir) has six coordinates and can be externally connected to three ligands. When the value of n is 1, the value of m is equal to 2. Therefore, the emission material of the embodiment can be the material whose chemical structures are represented by formulas [II]~[V]:

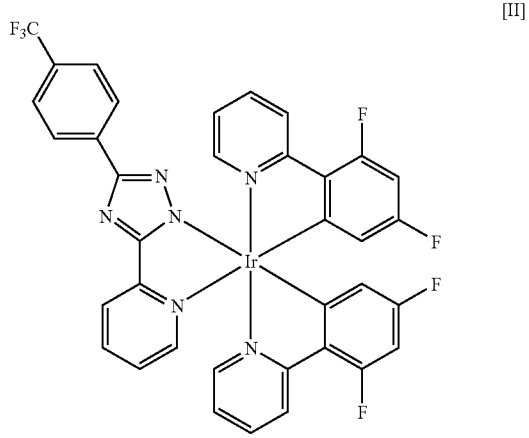

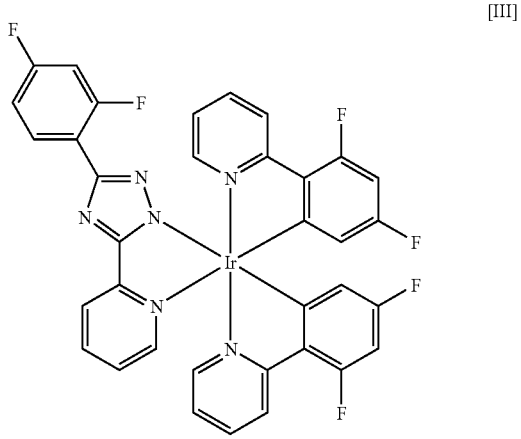

[IV]

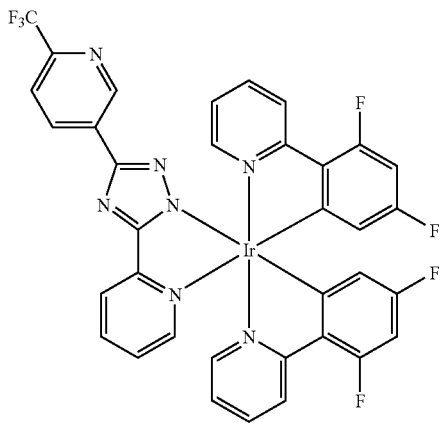

[V]

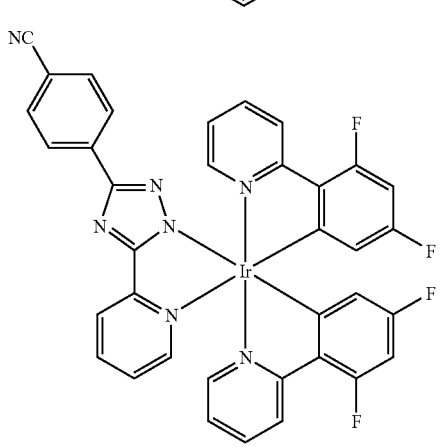

During the manufacturing process of the emission materials whose chemical structures are represented by formulas [III]~[V], at first, in step a, the (2,4-Difluoro-phenyl)-pyridine (2,4dfppy) ligand is synthesized and is denoted by chemical compound 1 whose synthetic reaction is represented by:

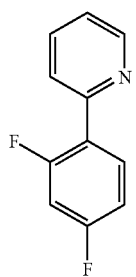

2

In step (a), at first, 1.0 g and 6.3 mmol of 2,4-Difluorophenyl boronic acid, 0.036 g and 0.16 mmol of acetic acid palladium [Pd(acetate)$_2$], and 0.168 g and 0.641 mmol of Triphenylphosphane are dispersed in 12 ml of potassium carbonate ($K_2CO_3$) water solution of 2M mol concentration and in 6 ml of 1,2-Dimethoxyethane solution. Next, 6.33 mmol and 0.6 ml of 2-Bromopyridine are dropwise added into the above resolution, and refluxed for 24 hours. After 24 hours of reaction are completed, the solution is left still for the solution temperature to be reduced to the room temperature. Next, the solvent is drained, and a yellowish brown solid is obtained.

The yellow solid is dissolved in approximately 60 ml of water, and then is extracted twice using dichloromethane ($Cl_2CH_2$) with the unit extraction volume being equal to 50 ml. Next, the organic layer in the extracted solution is obtained, and is then dehydrated using sodium sulfate ($Na_2SO_4$). A filter plate is used to filter the sodium sulfate and the overdosed and remnant catalyst. Then, a rotary concentrator is used to drain the solvent of the obtained organic layer to obtain a product. Next, the dichloromethane/hexane is used as the solvent according to re-crystallization, then a light yellow crystal product is obtained. The light yellow crystal product is exactly the above chemical compound 1, having an output of 0.43 g (2.25 mmol), and an output rate of 36%.

Next, proceed to step (b), [(24dfppy)$_2$Ir(μ—Cl)$_2$Ir(24df-ppy)$_2$] dimmer ligand is synthesized and is denoted by chemical compound 2 whose synthetic reaction is represented by:

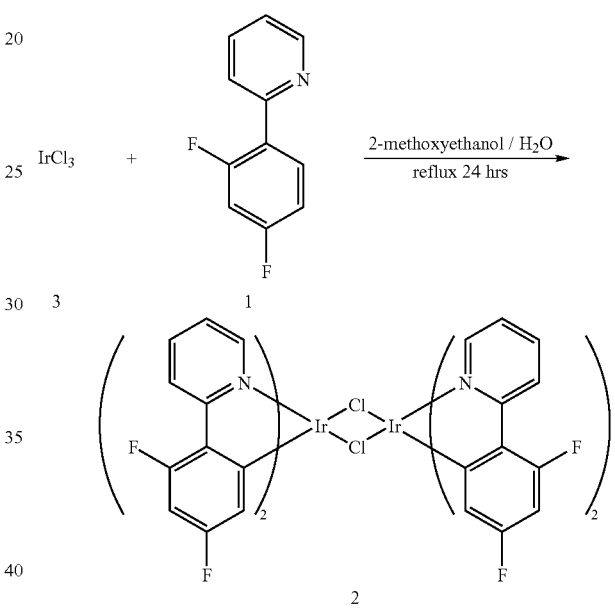

In step (b), at first, 3.0 g and 8.52 mmol of chlorine iridium (IrCl$_3$) denoted by chemical compound 3 and 3.74 g and 19.6 mmol of the chemical compound 1 are dissolved in a doping solution with the ratio of 2-methoxyethanol to water being 3:1, and refluxed for 24 hours. After 24 hours of reaction are completed, 20 ml of water are added to the above reaction solution, a large amount of solids would be obtained. Next, a product is obtained through ventilation filtering. Then, water and hexane are used to moisten and wash the product for several times, then the product is vacuum dried to obtain an iridium dimmer compound. The iridium dimmer compound is exactly the above chemical compound 2, having an output of 8.5 g (6.9 mmol), and an output rate of 82%.

Then, proceed to step (c), hydrazidines precursor is synthesized and is denoted by chemical compound 4 whose synthetic reaction is represented by:

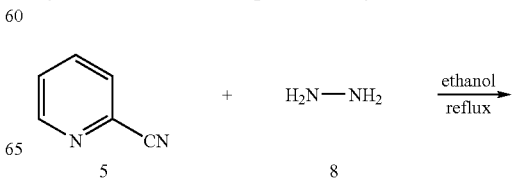

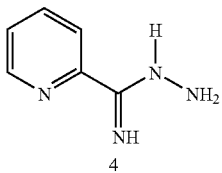

In step (c), at first, 15 ml and 155.7 mmol of 2-Cyanopyridine and 98%, 30 ml and 622.7 mmol of hydrazine denoted by chemical compound 8 are dissolved in appropriate amount of ethanol (EtOH) solvent, and are doped and refluxed for 2 hours under room temperature. After the reaction is completed, a rotary concentrator is used to drain the solvent. Then, the solvent is extracted using ether for three times. Next, magnesium sulfate is used to dehydrate and dry the solution, the solvent is drained, and a light yellow solid is obtained. Then, ethanol (EtOH) is used for re-crystallization to obtain a light yellow solid. The light yellow solid is exactly the above chemical compound 4, having an output of 16.5 g (121.5 mmol), and an output rate of 78%.

It is noteworthy that, the above steps (a)~(c) are the same with the steps of synthesizing the above the emission materials whose chemical structures are represented by formulas [III]~[V]. The subsequent manufacturing steps of the emission material whose chemical structure is represented by formulas [II] are exemplified below.

After the chemical compound 4 is synthesized, proceed to step (d1), [3-(4-Trifluoromethyl-phenyl)]-5-(2-pyridyl)-1,2,4-triazole ligand (CF$_3$—Ph—PytzH) is synthesized and is denoted by chemical compound 6 whose synthetic reaction is represented by:

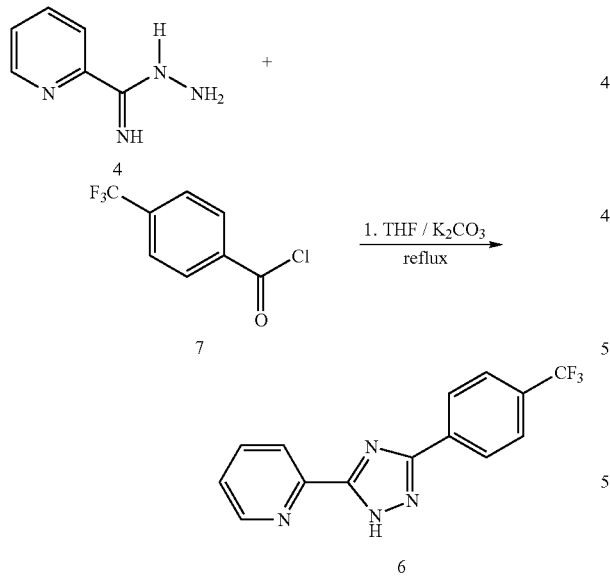

In step (d1), at first, 1.0 g and 4.80 mmol of 4-Trifluoromethylbenzoyl chloride denoted by chemical compound 7 is dissolved in 10 ml solution of Tetrahydrofuran (THF). Moreover, 0.65 g and 4.80 mmol of the chemical compound 4, and 0.33 g and 2.40 mmol of potassium carbonate are dissolved in 40 ml of Tetrahydrofuran solution. Next, the solution containing the chemical compound 7 and Tetrahydrofuran are dropwise added to the above solution containing the chemical compound 4, potassium carbonate and Tetrahydrofuran, then a precipitate is generated immediately. After 6 hours of reaction, a product is obtained through ventilation filtering. Next, water and hexane are used to moisten and wash the product for several times, then the product is vacuum dried. Then, the product is dissolved in the ethylene, heated and refluxed for 30 minutes then the reaction is terminated. After the solution is cooled down and left still for a period of time, a solid precipitate is generated. Next, ventilation filtering is applied, water and hexane are used to moisten and wash the solid precipitate for several times, and then the washed solid precipitate is vacuum dried to obtain an intermediate product which is drier now. Then, sublimation and purification process is applied to the intermediate product to obtain the above chemical compound 6. The above chemical compound 6 has an output of 1.05 g (3.61 mmol), and an output rate of 74%.

Then, proceed to step (e1), the chemical compounds 2 and 6 are used to synthesize the emission material whose chemical structure is represented by formulas [II]. As for the synthetic reaction of the formula [II] is represented by:

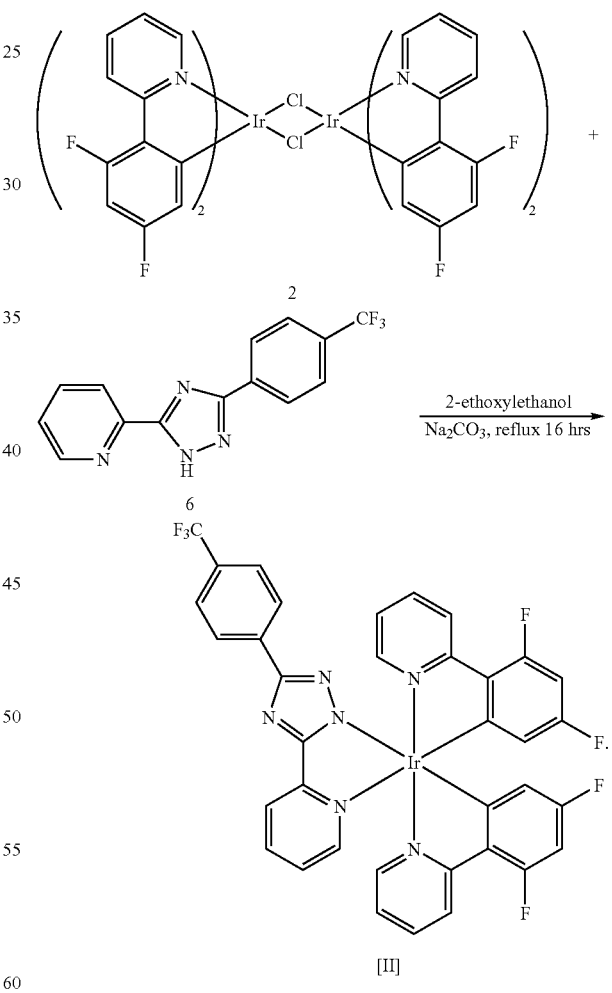

In step (e1), at first, 2.5 g and 2.0 mmol of the chemical compound 2, 1.31 g and 4.5 mmol of the chemical compound 6, and overdosed Na$_2$CO$_3$ are dissolved in 2-methoxyethanol solution to be refluxed for 16 hours. After 16 hours of reaction are completed, 20 ml of water are added to the above reaction solution, and a solid is generated. Next, ventilation filtering is applied, water and hexane are used to moisten and wash the solid for several times. Then, the obtained product is drained, and sublimation and purification process is applied to obtain the emission material whose chemical structure is represented by formulas [II]. The emission material whose chemical structure is represented by formulas [II] has an output of 1.46 g (1.7 mmol), and an output rate of 85%.

As for the subsequent manufacturing steps of the emission material whose chemical structure is represented by formulas [III] are exemplified below.

After the chemical compounds 2 and 4 are synthesized according to corresponding steps (a)~(c)中, proceed to step (d2), [3-(2-fluoro-4-fluoro-phenyl)]-5-(2-pyridyl)-1,2,4-triazole ligand (2F—Ph—PytzH) is synthesized, and is denoted by chemical compound 9. The synthetic reaction of the chemical compound 9 is represented by:

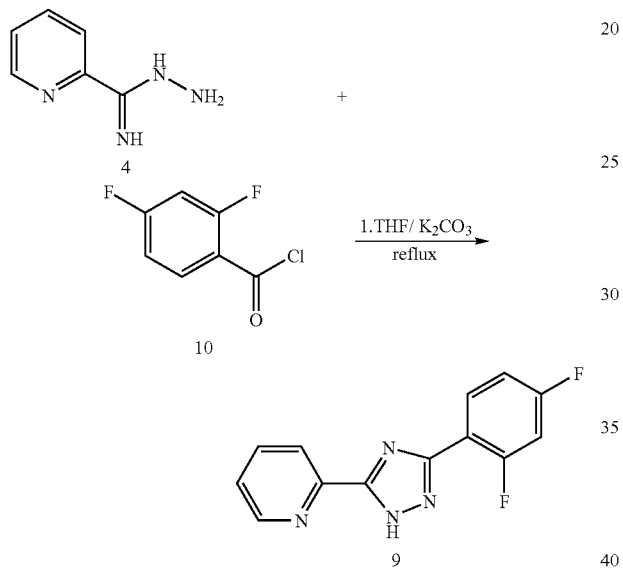

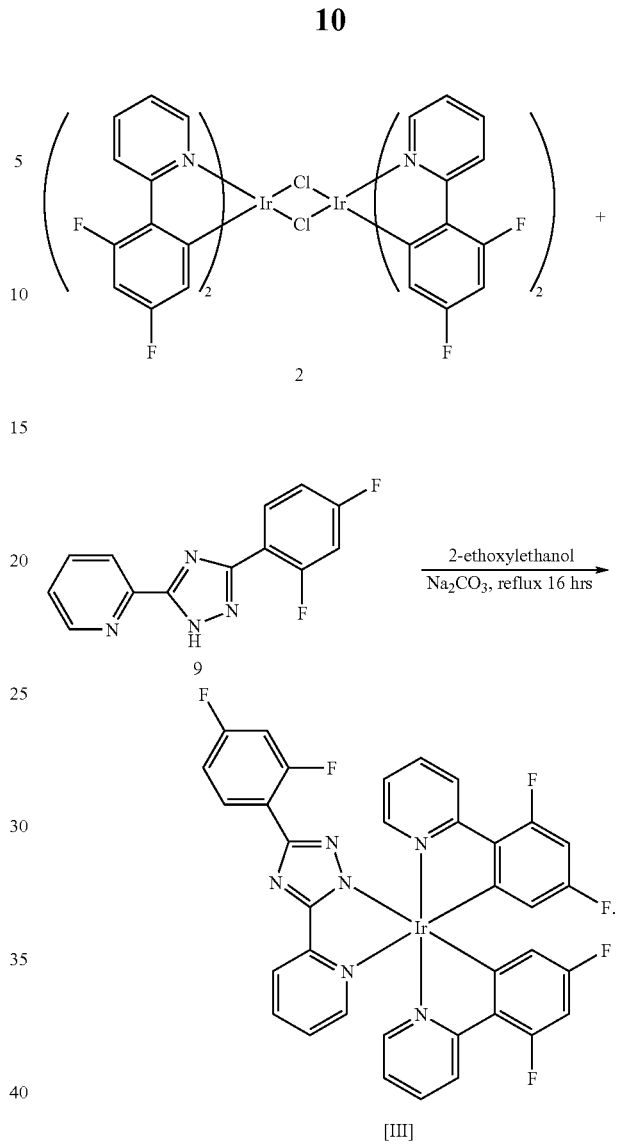

In step (d2), at first, 1.0 g and 5.7 mmol of the 2,4-Difluorobenzoyl chloride denoted by chemical compound 10 are dissolved in 10 ml of Tetrahydrofuran solution. Moreover, 0.78 g and 5.7 mmol of the chemical compound 4, and 0.40 g and 2.85 mmol of potassium carbonate are dissolved in the 40 ml of Tetrahydrofuran solution. Next, the solution containing the chemical compound 10 is dropwise added to the above solution containing the chemical compound 4, and a precipitate is generated immediately. After 6 hours of reaction, ventilation filtering is applied to obtain a product. Next, water and hexane are used to moisten and wash the product for several times, and then the product is vacuum dried. Then, the product is dissolved in the ethylene, heated and refluxed for 30 minutes then the reaction is terminated. Next, the product is cooled down and left still for a period of time, then a solid precipitate is generated. Then, ventilation filtering is applied, water and hexane are used to moisten and wash the solid precipitate for several times, and then the washed solid precipitate is vacuum dried to the final product. The final product is exactly the above chemical compound 9 having an output of 1.15 g (4.45 mmol), and an output rate of 78%.

Then, proceed to step (e2), the chemical compounds 2 and 9 are used to synthesize the emission material whose chemical structure is represented by formulas [III]. The synthetic reaction of the formula [III] is represented by:

In step (e2), at first, 2.5 g and 2.0 mmol of the chemical compound 2, 1.14 g and 4.4 mmol of the chemical compound 9, and overdosed $Na_2CO_3$ are dissolved in 2-methoxyethanol solution, and refluxed for 16 hours. After 16 hours of reaction are completed, 20 ml of water are added to the above reaction solution, then a solid is generated. Next, ventilation filtering is applied, and water and hexane are used to moisten and wash the solid for several times. Then, the collected product is drained, then the sublimation and purification process is applied to obtain the emission material whose chemical structure is represented by formulas [III]. The emission material whose chemical structure is represented by formulas [III] has an output of 0.96 g (1.2 mmol), and an output rate of 58%.

As for the subsequent manufacturing steps of the emission material whose chemical structure is represented by formulas [IV] are exemplified below.

After the chemical compound 2 and 4 are synthesized according to corresponding steps (a)~(c), proceed to step (d3), [3-(4-Trifluoromethyl-pyridyl)]-5-(2-pyridyl)-1,2,4-triazole ligand ($CF_3$—Py—PytzH) is synthesized and is denoted by chemical compound 11. As for the synthetic reaction of the chemical compound 11 is represented by:

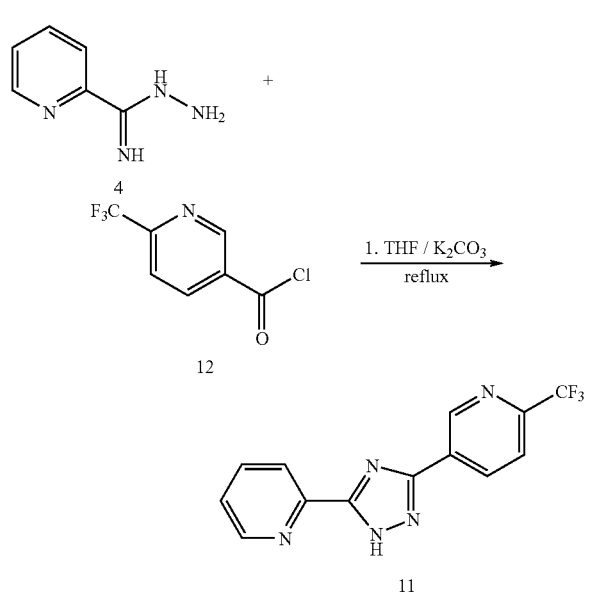

In step (d3), at first, 1.0 g and 4.8 mmol of 6-Trifluoromethyl-nicotinyl chloride denoted by chemical compound 12 are dissolved in 10 ml of Tetrahydrofuran solution. Moreover, 0.65 g and 4.8 mmol of the chemical compound 4, and 0.33 g and 2.40 mmol of potassium carbonate are dissolved in the 40 ml of Tetrahydrofuran solution. Next, the solution containing the chemical compound 12 are added dropwise to the above solution containing the chemical compound 4, then a precipitate is generated immediately. After 6 hours of reaction, ventilation filtering is applied to obtain a product. Next, water and hexane are used to moisten and wash the product for several times, and then the product is vacuum dried. Then, the product is dissolved in the ethylene, heated and refluxed for 30 minutes, then the reaction is terminated. Next, after the product is cooled down and left still for a period of time, a solid precipitate is generated. Then, ventilation filtering is applied, water and hexane are used to moisten and wash the solid precipitate for several times, the washed solid precipitate is vacuum dried to obtain a final product. The product is exactly the above chemical compound 11, having an output of 1.01 g (3.43 mmol), and an output rate of 72%.

Then, proceed to step (e3), the chemical compound 2 and 11 are used to synthesize the emission material whose chemical structure is represented by formulas [IV]. The synthetic reaction of the formula [IV] is represented by:

In step (e3), at first, 2.5 g and 2.0 mmol of the chemical compound 2, 1.32 g and 4.5 mmol of the chemical compound 11 and overdosed $Na_2CO_3$ are dissolved in 2-methoxyethanol solution, and refluxed for 16 hours. After 16 hours of reaction are completed, 20 ml of water are added to the above reaction solution, a solid is generated. Next, ventilation filtering is applied, water and hexane are used to moisten and wash the solid for several times. Then, the collected product is drained, and sublimation and purification process is applied to obtain the emission material whose chemical structure is represented by formulas [IV]. The emission material whose chemical structure is represented by formulas [IV] has an output of 1.12 g (1.3 mmol), and an output rate of 65%.

As for the subsequent manufacturing steps of the emission material whose chemical structure is represented by formulas [V] are exemplified below.

After the chemical compounds 2 and 4 are synthesized according to corresponding steps (a)-(c), proceed to step (d4), 3-Cyano-phenyl-5-(2-pyridyl)-1,2,4-triazole ligand (CN—Ph—PytzH) is synthesized and denoted by chemical compound 13. The synthetic reaction of the chemical compound 13 is represented by:

-continued

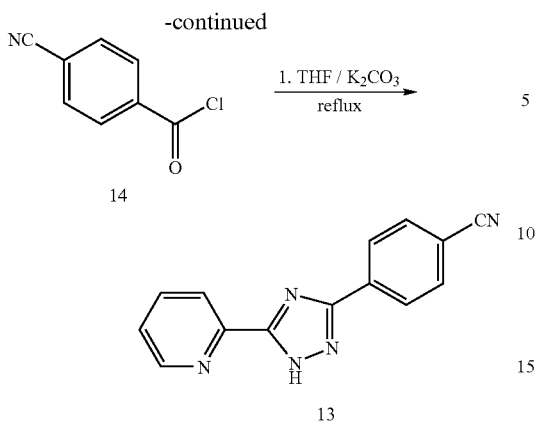

In step (d4), at first, 1.0 g and 6.0 mmol of 4-Cyanobenzoyl chloride denoted by chemical compound 14 are dissolved in 10 ml of Tetrahydrofuran solution. Moreover, 0.82 g and 6.0 mmol of the chemical compound 4, and 0.41 g and 3.0 mmol of potassium carbonate are dissolved in the 40 ml of Tetrahydrofuran solution. Next, the solution containing the chemical compound 14 is added dropwise to the above solution containing the chemical compound 4, and then a precipitate is generated immediately. After 6 hours of reaction are completed, ventilation filtering is applied to obtain a product. Next, water and hexane are used to moisten and wash the product for several times, then the product is vacuum dried. Then, the product is dissolved in the ethylene, heated and refluxed for 30 minutes, then the reaction is terminated. Next, after the product is cooled down and left still for a period of time, a solid precipitate is generated. Then, ventilation filtering is applied, water and hexane are used to moisten and wash the solid precipitate for several times, then the washed solid precipitate is vacuum dried to obtain a final product. The final product is exactly the above chemical compound 13, having an output of 1.1 g (4.5 mmol), and an output rate of 75%.

Then, proceed to step (e4), the chemical compounds 2 and 13 are used to synthesize the emission material whose chemical structure is represented by formulas [V]. The synthetic reaction of the formula [V] is represented by:

-continued

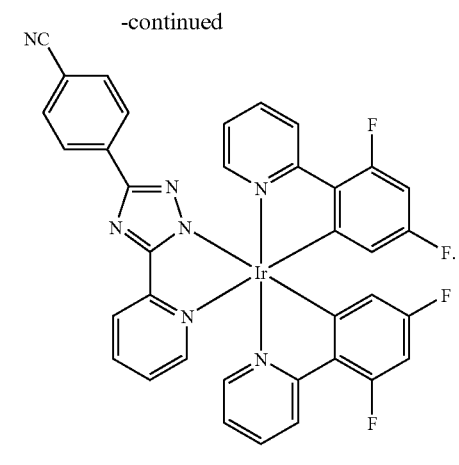

[V]

In step (e4), at first, 2.5 g and 2.0 mmol of the chemical compound 2, 1.11 g and 4.5 mmol of the chemical compound 13, and overdosed $Na_2CO_3$ are dissolved in 2-methoxyethanol solution, and refluxed for 16 hours. After 16 hours of reaction are completed, 20 ml of water are added to the above reaction solution, a solid is generated. Next, ventilation filtering is applied, and water and hexane are used to moisten and wash the solid for several times. Then, the collected product is drained, and sublimation and purification process is applied to obtain the emission material whose chemical structure is represented by formulas [V]. The emission material whose chemical structure is represented by formulas [V] has an output of 0.85 g (1.04 mmol), and an output rate of 52%.

In the present embodiment, a Hitachi F-4500 spectrophotometer is used to observe the photoluminescence spectra (PL) of the above emission materials whose chemical structures are represented by formulas [II]~[V] when in thin film state or solution state. For example, the photoluminescence spectra of the above emission materials whose chemical structures are represented by formulas [II]~[V] when in dichloromethane solution is observed. The $\lambda_{max}$ (nm) of respective emission material in solution state can be known according to the photoluminescence spectra of respective emission material in solution state. Besides, the $\lambda_{max}$ (nm) and CIE[x, y] value of respective emission material are recorded in the table below.

| emission material | $\lambda_{max}$(nm) | CIE[x, y] value |
| --- | --- | --- |
| chemical formula [II] | 462, 490 | 0.13, 0.25 |
| chemical formula [III] | 468, 492 | 0.13, 0.32 |
| chemical formula [IV] | 468, 490 | 0.14, 0.31 |
| chemical formula [V] | 468, 492 | 0.14, 0.32 |

It can be seen from the above table that the $\lambda_{max}$ of the emission materials whose chemical structures are represented by formulas [II]~[V] when in solution state are respectively within the range of blue photochromism, and the CIE[x, y] values of the emission materials whose chemical structures are represented by formulas [II]~[V] are also within blue region. The emission materials whose chemical structures are represented by formulas [II]~[V] has a bluer photochromism than conventional Flrpic blue phosphorescent material does, and the CIE[x, y] value of the emission material whose chemical structure is represented by formulas [II] has a bluer photochromism than the CIE value of the emission materials whose chemical structures are represented by formulas [III]

~[V]. Therefore, the emission materials whose chemical structures are represented by formulas [II]~[V] are ideal for the blue emission material such as the blue phosphorescent the emission material for instance. However, the technology of the embodiment is not limited thereto. For example, the emission materials whose chemical structures are represented by formulas [II]~[V] can also be used as the blue fluorescent the emission material or the emission material of other colors, such as the phosphorescent or the fluorescent emission material of other colors.

The emission material disclosed in the embodiment has the features of easy sublimation, quick response and high output rate and is capable of resolving the problems of difficult sublimation, poor heat-stability, and long purification time encountered in the conventional manufacturing process of the Flrpic blue phosphorescent material. With the features of easy sublimation, quick response and high output rate, the new emission material of the embodiment purification time requires shorter purification time than the conventional Flrpic blue phosphorescent material does, and is a breakthrough in terms of the research and development of the blue phosphorescent material.

Second Embodiment

Referring to FIG. 1, a structural diagram of an OLED according to a second embodiment of the invention is shown. In the embodiment, the OELD, including organic light emitting diode (OLED) of small molecules and polymer light emitting diode (PLED), is exemplified by the OLED here. However, the technology disclosed in the embodiment is applicable to the PLED.

In FIG. 1, the OELD 10 includes a substrate 11, an anode 12, a cathode 13, a hole transport layer 14, an electron transport layer 15 and an emission layer 16. The anode 12 and the cathode 13 are disposed on the substrate 11. The hole transport layer 14 is disposed between the anode 12 and the cathode 13. The electron transport layer 15 is disposed between the hole transport layer 14 and the cathode 13. The emission layer 16 is disposed between the hole transport layer 14 and the electron transport layer 15, and the emission layer 16 includes a host and a dopant. The chemical structure of the dopant is represented by the formula [I]:

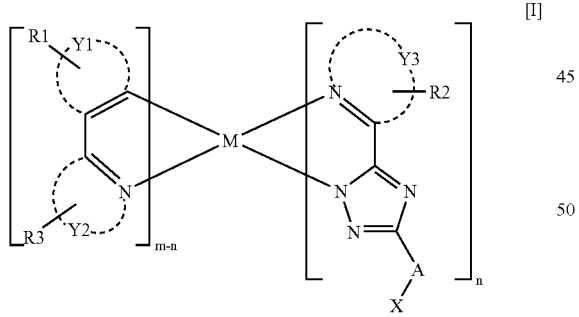

"M" represents a metal atom whose atomic weight is greater than 40. m is smaller than or equal to the ligand number of "M". n is a positive integral and is smaller than m. "Y1" is selected from aryl or heteroaryl. "Y2" and "Y3" are respectively selected from nitrogen-containing heterocyclic ring. "X", "R1", "R2" and "R3" are respectively selected from any substituent group or hydrogen. "A" is selected from aryl, heteroaryl or nitrogen-containing heterocyclic group.

"M" is selected from osmium (Os), ruthenium (Ru), iridium (Ir), platinum (Pt), rhenium (Re), thallium (Tl), palladium (Pd) or rhodium (Rh)

"A" is selected from pyridine, benzene, naphthalene, anthracene, phenanthrene or biphenyl.

"X", "R1", "R2" and "R3" are respectively selected from alkyl, alkoxy, haloakyl, halogen, cyano group or electron-withdrawing group.

Moreover, the emission material disclosed above can be a blue emission material such as a blue phosphorescent dopant. Besides, the emission material of the embodiment can also be manufactured of phosphorescent material or fluorescent material of other colors. In the embodiment, the value of n is 1.

In the embodiment, the emission material can be formed by iridium (Ir) and pyridyl-triazole ligand I. The iridium (Ir) has six coordinates, and can be externally connected to three ligands. When the value of n is 1, the value of m is equal to 2. Therefore, the emission material of the embodiment can be the material whose chemical structures are represented by formulas [II]~[V]:

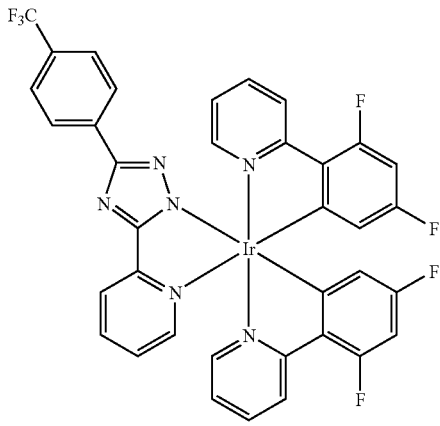

[II]

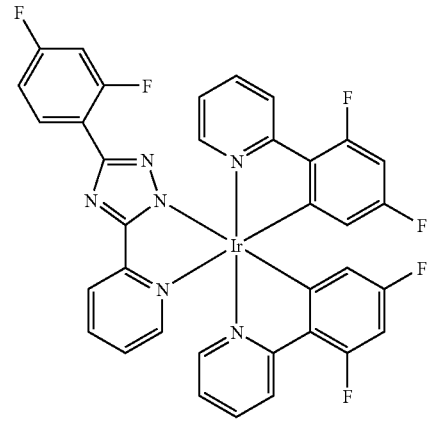

[III]

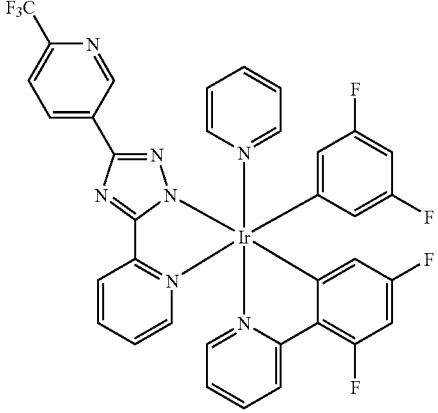

[IV]

-continued

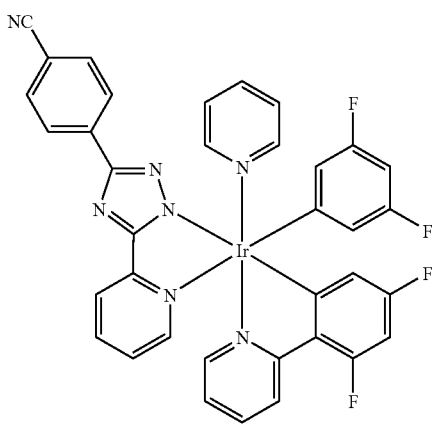

[V]

In the embodiment, the OELD 10 further includes a hole injection layer 17 disposed between the hole transport layer 14 and the anode 12. Besides, the OELD 10 further includes an electron injection layer 18 disposed between the electron transport layer 15 and the cathode 13. Moreover, the OELD 10 further includes a hole blocking layer 19 disposed between the electron transport layer 15 and the emission layer 16.

The electrical injection effect, brightness, luminous efficiency and photo-electro conversion efficiency of the device are elaborated below. In the embodiment, the substrate 11, the anode 12, the cathode 13, the host and the dopant are respectively exemplified by a glass substrate, indium tin oxide (ITO), a cathode composed of lithium fluoride (LiF) and aluminum (Al), N,N'-dicarbozale-1,3-benzene (mCP), and the emission material whose chemical structure is represented by formulas [IV]. Besides, the change in the electrical injection effect, brightness, luminous efficiency and photo-electro conversion efficiency of the device are observed by changing the doping concentration of the emission material whose chemical structure is represented by formulas [IV] in mCP. When the doping concentration of the emission material whose chemical structure is represented by formulas [IV] in mCP is between 10~12%, the device has a better performance in terms of electrical injection effect, brightness, luminous efficiency and photo-electro conversion efficiency. The device can reach the luminous efficiency as high as 10.7 (cd/A), however, the technology of the embodiment is not limited thereto.

As for the photochromism of the device using the emission material whose chemical structure is represented by formulas [IV], when the dopant has a larger doping concentration, the CIE[x, y] value of the device grows larger as well, but is still within the blue region. The CIE[x, y] value of device approximately falls within in the range of [0.16, 0.28]. When the doping concentration of the dopant is fixed, the CIE[x, y] value of the device may slightly decrease as the operating voltage of the device increases, but is still within the blue region. The $\lambda_{max}$ of the device using the emission material whose chemical structure is represented by formulas [IV] is 464 (nm) and only differs by 4 (nm) with the $\lambda_{max}$ 468 (nm) of the emission material whose chemical structure is represented by formulas [IV] when in solution state.

Therefore, the device has a best performance when the doping concentration of the dopant is about 12%. The doping concentration of the dopant being too high or too low is disadvantageous to the performance of the device.

Moreover, the emission material whose chemical structure is represented by formula [II] is the dopant, and the doping concentration of the emission material whose chemical structure is represented by formulas [II] in mCP is fixed at 11%. Then the electrical injection effect, brightness, luminous efficiency and photo-electro conversion efficiency of the device are observed by changing the thickness of the electron transport layer. When the thickness of the electron transport layer grows thicker, the electrical injection effect of the device becomes poorer, but the luminous efficiency and photo-electro conversion efficiency become better. The luminous efficiency of the device can reach as high as 9.2 (cd/A). The brightness of the device does not show much difference with respect to the thickness of the electron transport layer. However, the technology of the embodiment is not limited thereto.

As for the photochromism of the device using the emission material whose chemical structure is represented by formulas [II], the photochromism of the device is blue when the CIE[x, y] value approximately falls within the range of [0.16, 0.27]. However, the CIEy value of the device declines as the operating voltage increases. When the thickness of the electron transport layer becomes thicker, the CIE[x, y] value of device becomes lower, but is still within the blue region. The $\lambda_{max}$ of device using the emission material whose chemical structure is represented by formulas [II] is 464 (nm) and only differs by 2 (nm) with the λmax 462 (nm) of the emission material whose chemical structure is represented by formulas [II] when in solution state.

According to the above disclosure, the device using the emission materials whose chemical structures are represented by [II]~[V] can be blue devices such as a blue phosphorescent device for instance. However, the technology of the embodiment is not limited thereto. For example, the emission materials whose chemical structures are represented by formulas [II]~[V] can be blue or other colored fluorescent device, such as the phosphorescent or fluorescent device of other colors for instance.

However, anyone who is skilled in the technology of the embodiment will understand that the technology of the invention is not limited thereto. For example, the anode 12 and the cathode 13 include metal, metal alloy or transparent conductive material. At lease one of the anode 12 and the cathode 13 is a transparent or semi-transparent electrode. The above transparent conductive material includes transparent metal oxides such as indium tin oxide (ITO), indium zinc oxide (IZO), cadmium tin oxide (CTO), stannim dioxide ($SnO_2$) and zinc oxide (ZnO). The above metal and metal alloy include aurum (Au), aluminum (Al), indium (In), magnesium (Mg) and calcium (Ca) and so forth.

When only the anode 12 is transparent or semi-transparent, the cathode 13 can be a reflective metal, then the OELD 10 is a bottom emission and the substrate 11 is a transparent or semi-transparent the substrate. When only the cathode 13 is transparent or semi-transparent, the anode 12 can be a reflective metal, then the OELD 10 is top emission device and the substrate 11 can be a transparent, semi-transparent or transparent substrate. When the anode 12 and the cathode 13 are both transparent or semi-transparent, the OELD 10 is a dual emission device and the substrate 11 is a transparent or semi-transparent substrate.

The OELD 10 of the present embodiment can be applied to electronic products such as computer screen, flat TV, monitor screen, vehicle TV, mobile phone, handheld game station, digital camera (DC), digital video (DVD), digital audio device, personal digital assistant (PDA), web pad, notebook, handheld computer, laptop computer, table PC, and so forth.

Third Embodiment

Figure 2:
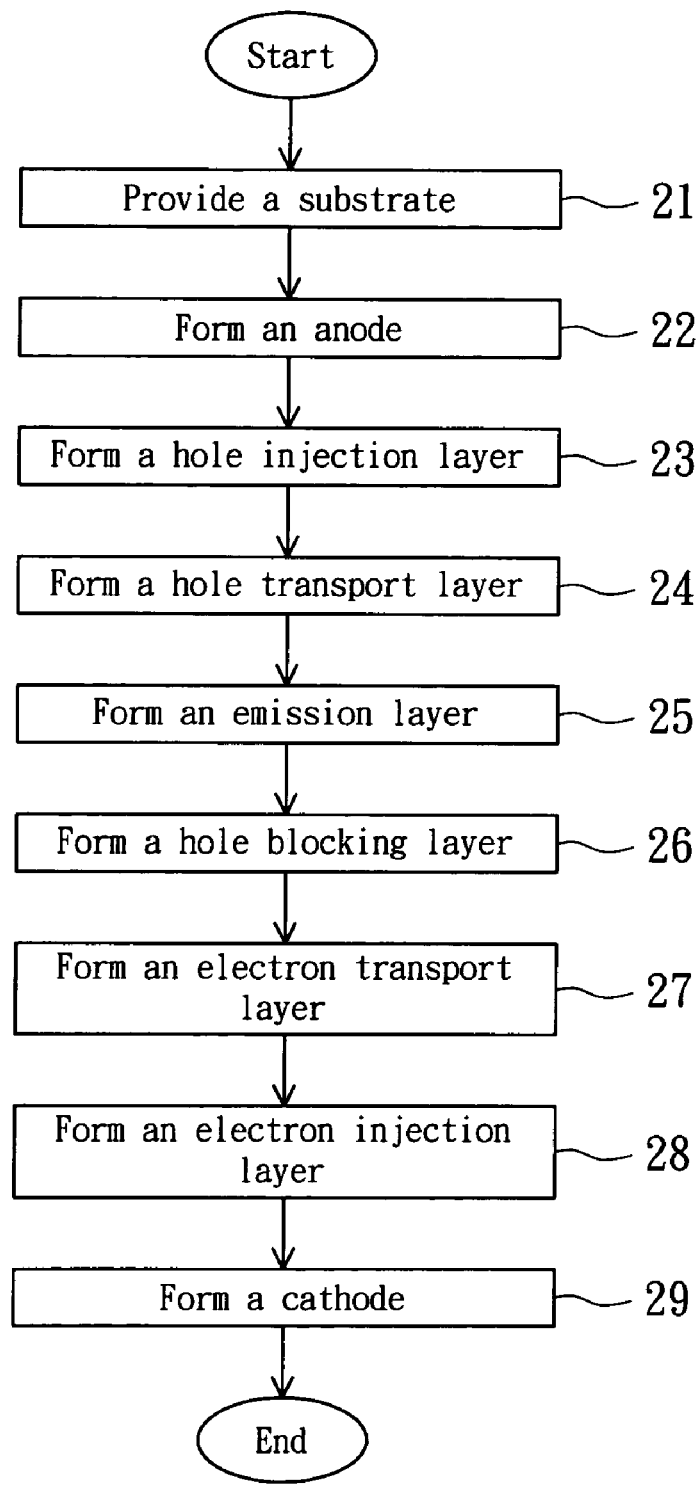
FIG. 2 is a flowchart of the manufacturing method of an OLED according to a third embodiment of the invention.

Referring to FIG. 2 is a flowchart of the manufacturing method of an OLED according to a third embodiment of the invention is shown. Refer to FIG. 1 at the same time. At first, the method begins at step 21, a substrate 11 is provided. Next, proceed to step 22, an anode 12 is formed on the substrate 11. Then, proceed to step 23, a hole injection layer 17 is formed on the anode 12. Next, proceed to step 24, a hole transport layer 14 is formed on the hole injection layer 17. Then, proceed to step 25, an emission layer 16 is formed on the hole transport layer 14. The emission layer 16 has a host and a dopant. The chemical structure of the dopant is represented by formulas [I]. Next, proceed to step 26, a hole blocking layer 19 is formed on the emission layer 16. Afterwards, proceed to step 27, an electron transport layer 15 is formed on the hole blocking layer 19. Next, proceed to step 28, an electron injection layer 18 is formed on the electron transport layer 15. At last, proceed to step 29, a cathode 13 is formed on the electron injection layer 18, and the OELD 10 is completed.

Despite the emission material of the embodiment is exemplified by the dopant, the technology of the embodiment is not limited thereto. For example, the emission material of the embodiment can be used as a host to form an emission layer with other dopants.

According to the emission material disclosed in the embodiment of the invention and the OELD using the same, the emission material formed by iridium and pyridyl-triazole ligand has the features of easy sublimation, quick response and high output rate and is capable of resolving the problems of difficult sublimation, poor heat-stability, and long purification time encountered in the conventional manufacturing process of the Flrpic blue phosphorescent material. With the features of easy sublimation, quick response and high output rate, the new emission material formed according to the embodiment requires shorter purification time than the conventional Flrpic blue phosphorescent material.

Besides, the $\lambda_{max}$ of the emission material of the embodiment in resolution is 462,492 (nm), the $\lambda_{max}$ of the device using the emission material of the embodiment is 464,488 (nm), and the CIE[x, y] value of device is [0.16, 0.27]. However, the $\lambda_{max}$ of the Flrpic blue phosphorescent material in solution state is 476,492 (nm), the $\lambda_{max}$ the device using the Flrpic blue phosphorescent material, is 475,498 (nm), and the CIE[x, y] value of device is [0.16, 0.29]. It can be seen from the above comparison that the emission material of the embodiment has a bluer photochromism than the Flrpic blue phosphorescent material does, and the device using the emission material of the embodiment has a bluer photochromism than the device using Flrpic blue phosphorescent material. It can be seen that the emission material of the invention is ideal for the blue phosphorescent material, applicable to a blue phosphorescent device, and is indeed a big breakthrough in terms of the research and development of the blue phosphorescent material.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An emission material whose chemical structure is represented by formula [I]:

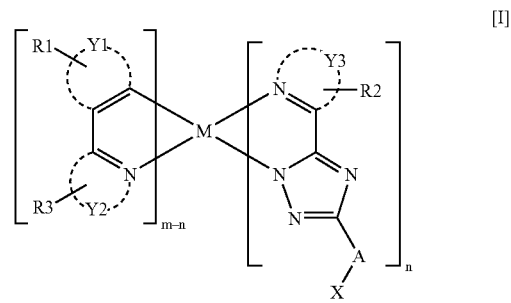

wherein "M" represents a metal atom whose atomic weight is greater than 40, m is smaller than or equal to the ligand number of "M", n is a positive integral and is smaller than m, "Y1" is selected from aryl or heteroaryl, "Y2" and "Y3" are independently selected from nitrogen-containing heterocyclic ring, "R1", "R2" and "R3" are independently selected from any substituent group or hydrogen, "A" is selected from a group consisted of naphthalene, anthracene, phenanthrene and biphenyl, and "X" is haloalkyl, halogen, cyano group or any other electron-withdrawing group.

2. The emission material according to claim 1, wherein "M" is selected from osmium (Os), ruthenium (Ru), iridium (Ir), platinum (Pt), rhenium (Re), thallium (Tl), palladium (Pd) or rhodium (Rh).

3. The emission material according to claim 1, wherein "R1", "R2" and "R3" are independently selected from alkyl, alkoxy, haloalkyl, halogen, cyano group or any other electron-withdrawing group.

4. The emission material according to claim 1, wherein the value of n is 1.

5. The emission material according to claim 1, being a blue phosphorescent dopant.

6. An organic electroluminescent device (GELD), comprising:
   a substrate;
   an anode and a cathode, disposed on the substrate;
   a hole transport layer disposed between the anode and the cathode;
   an electron transport layer disposed between the hole transport layer and the cathode; and
   an emission layer disposed between the hole transport layer and the electron transport layer, wherein the emission layer comprises a host and a dopant, and the dopant is an emission material whose chemical structure is represented by the formula [I] according to claim 1.

* * * * *

UNITED STATES PATENT AND TRADEMARK OFFICE
CERTIFICATE OF CORRECTION

PATENT NO.        : 7,662,486 B2  Page 1 of 1
APPLICATION NO.  : 11/251900
DATED            : February 16, 2010
INVENTOR(S)      : Pei-Chi Wu It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 581 days.

Signed and Sealed this

Twenty-eighth Day of December, 2010

David J. Kappos
*Director of the United States Patent and Trademark Office*